(12) United States Patent
Gruber et al.

(10) Patent No.: US 12,015,417 B2
(45) Date of Patent: Jun. 18, 2024

(54) INPUT BUFFER CIRCUIT, ANALOG-TO-DIGITAL CONVERTER SYSTEM, RECEIVER, BASE STATION, MOBILE DEVICE AND METHOD FOR OPERATING AN INPUT BUFFER CIRCUIT

(71) Applicant: Intel Corporation, Santa Clara, CA (US)

(72) Inventors: Daniel Gruber, St. Andrae (AT);
Matteo Camponeschi, Villach (AT);
Christian Lindholm, Villach (AT);
Martin Clara, Santa Clara, CA (US);
Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 662 days.

(21) Appl. No.: 17/131,868

(22) Filed: Dec. 23, 2020

(65) Prior Publication Data
US 2022/0200613 A1    Jun. 23, 2022

(51) Int. Cl.
  *H03M 1/06*    (2006.01)
  *H03K 3/02*    (2006.01)
  *H04B 1/16*    (2006.01)
(52) U.S. Cl.
  CPC ............ *H03M 1/0609* (2013.01); *H03K 3/02* (2013.01); *H04B 1/16* (2013.01)

(58) Field of Classification Search
  CPC ............ H03M 1/0609; H03M 1/1215; H03M 1/1245; H03M 1/181; H03M 1/187; H03K 3/02; H04B 1/16
  See application file for complete search history.

(56) References Cited

U.S. PATENT DOCUMENTS

| 2013/0285667 A1* | 10/2013 | Koduka | G01R 19/0084 324/433 |
| 2020/0057484 A1* | 2/2020 | Coln | G06F 1/3287 |

\* cited by examiner

*Primary Examiner* — Sung S Ahn
(74) *Attorney, Agent, or Firm* — 2SPL Patent Attorneys PartG mbB; Yong Beom Hwang

(57) ABSTRACT

An input buffer circuit for an analog-to-digital converter is provided. The input buffer circuit includes a buffer amplifier. The buffer amplifier includes a first input node and a second input node each configured to receive a respective one of a first input signal and a second input signal forming a differential input signal pair for the analog-to-digital converter. The buffer amplifier further includes a first output node and a second output node each configured to output a respective one of a first buffered signal and a second buffered signal. In addition, the input buffer circuit includes feedback circuitry. The feedback circuitry is configured to generate, based on the first buffered signal and the second buffered signal, a first feedback signal and a second feedback signal for mitigating a respective unwanted signal component at the first input node and the second input node related to a limited reverse isolation of the amplifier buffer. The feedback circuitry is further configured to supply the first feedback signal to the first input node and the second feedback signal to the second input node.

25 Claims, 8 Drawing Sheets

INPUT BUFFER CIRCUIT, ANALOG-TO-DIGITAL CONVERTER SYSTEM, RECEIVER, BASE STATION, MOBILE DEVICE AND METHOD FOR OPERATING AN INPUT BUFFER CIRCUIT

FIELD

The present disclosure relates to input buffering for Analog-to-Digital Converters (ADCs). In particular, examples relate to an input buffer circuit for an ADC, an ADC system comprising the input buffer circuit, a receiver comprising the ADC system, a base station comprising the receiver, a mobile device comprising the receiver and a method for operating an input buffer circuit for an ADC.

BACKGROUND

An ADC is typically preceded by a buffer. For Radio Frequency (RF) applications with signal frequencies of more than 1 GHz, the signal source has a certain characteristic impedance. For example, for balanced (i.e. fully differential) signal paths the impedance $Z_0$ is typically 100Ω. The buffer driving a high-speed ADC potentially generates nonlinear content at the output of the buffer. Since the reverse-isolation of the buffer is finite, a certain portion of the nonlinear signal content generated at the buffer output is reflected back to the buffer input and appears across the signal source impedance $Z_0$.

Hence, there may be a desired for improved input buffering for ADCs.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
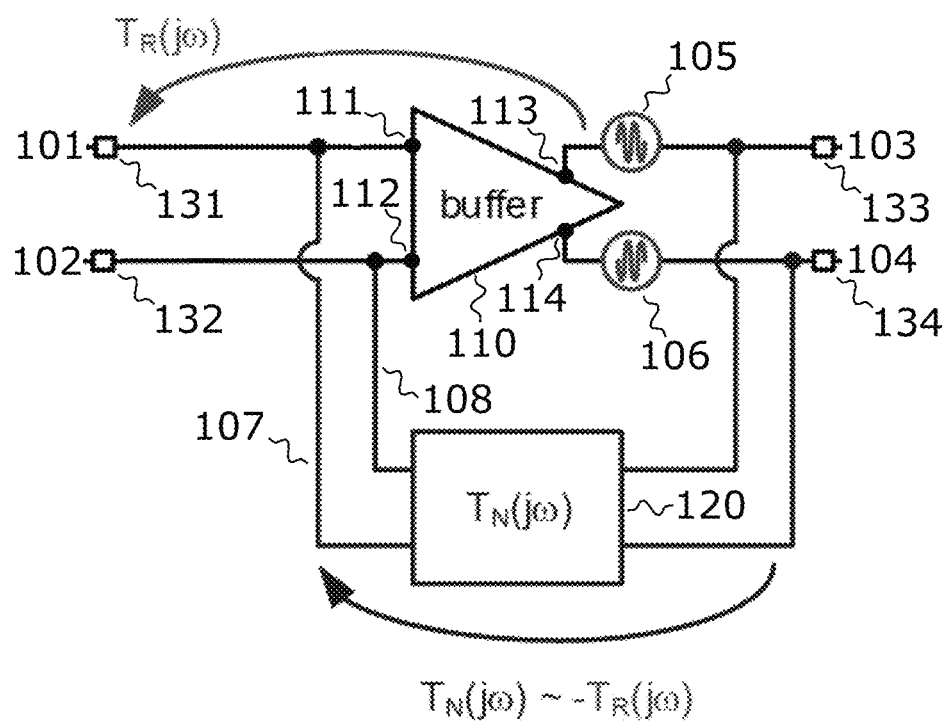
FIG. 1 illustrates a first example of an input buffer circuit.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of an input buffer circuit 100 for an ADC. The input buffer circuit comprises a buffer amplifier 110 and feedback circuitry 120.

The buffer amplifier 110 comprises a first input node 111 and a second input node 112 each configured to receive a respective one of a first input signal 101 and a second input signal 102. The first input signal 101 and the second input signal 102 form a differential input signal pair for the ADC. For example, the first input node 111 of the buffer amplifier 110 may be coupled to a first input node 131 of the input buffer circuit 100 for receiving the first input signal 101. Similarly, the second input node 112 of the buffer amplifier 110 may be coupled to a second input node 132 of the input buffer circuit 100 for receiving the second input signal 102. For example, the input nodes 131 and 132 of the input buffer circuit 100 may couple to a signal source (impedance) such as an antenna or an RF front-end.

The buffer amplifier 110 is configured to generate a first buffered signal 103 based on the first input signal 101. Similarly, the buffer amplifier 110 is configured to generate a second buffered signal 104 based on the second input signal 102.

The buffer amplifier 110 comprises a first output node 113 and a second output node 114 each configured to output a respective one of the first buffered signal 103 and the second buffered signal 104. For example, the first output node 113 of the buffer amplifier 110 may be coupled to a first output node 133 of the input buffer circuit 100 for outputting the first buffered signal 103. Similarly, the second output node 114 of the buffer amplifier 110 may be coupled to a second output node 134 of the input buffer circuit 100 for outputting the second buffered signal 104. The ADC is coupled to the output nodes 133 and 134 of the input buffer circuit 100 for receiving the buffered signals 103 and 104.

The buffering operation of the buffer amplifier 110 provides an impedance transformation between the ADC and the circuitry preceding the input buffer circuit 100. The buffer amplifier 110 may comprise various circuitry for providing the impedance transformation. For example, the buffer amplifier 110 may comprise one or more transistors (e.g. in a source-follower configuration) for performing the impedance transformation.

As the reverse isolation of the buffer amplifier 110 is limited (finite), part of the buffered signals 103 and 104 is reflected back from the output nodes 113 and 114 of the buffer amplifier 110 to the input nodes 111 and 112 of the buffer amplifier 110. This effect is called "kickback". The reflected signal components may combine with the input signals 101 and 102 at the input nodes 111 and 112. Accordingly, the reflected signals components may appear at the signal source coupling to the input nodes 131 and 132 of the input buffer circuit 100. For example, non-linear signal content generated at the output nodes 113 and 114 of the buffer amplifier 110 due to the high-speed switching activity of the coupled ADC may pass through the buffer amplifier 110 due to its finite reverse isolation such that the non-linear signal content may combine with the input signals 101 and 102 at the input nodes 111 and 112. The non-linear signal content generated at the output nodes 113 and 114 is symbolized by the oscillatory waveforms 105 and 106 in FIG. 1.

The feedback circuitry 120 is used to compensate for the kickback from the output node 113 and 114 to the input nodes 111 and 112 of the buffer amplifier 110. In particular, the feedback circuitry 120 is configured to generate, based on the first buffered signal 103 and the second buffered signal 104, a first feedback signal 107 and a second feedback signal 108 for mitigating the respective unwanted signal component at the first input node 111 and the second input node 112 that is related to (caused due) the limited reverse isolation of the amplifier buffer 110. For example, the feedback circuitry 120 may be configured to generate the first feedback signal 107 based on the first buffered signal 103, the second buffered signal 104 or both. Similarly, the feedback circuitry 120 may be configured to generate the second feedback signal 108 based on the first buffered signal 103, the second buffered signal 104 or both.

As indicated in FIG. 1, the feedback circuitry 120 is further configured to supply the first feedback signal 107 to the first input node 111 of the buffer amplifier 110 and to supply the second feedback signal 108 to the second input node 112 of the buffer amplifier 110.

Accordingly, the first feedback signal 107 and the second feedback signal 108 may combine with the respective unwanted signal component at the first input node 111 and the second input node 112 such that the respective unwanted signal component is mitigated or neutralized at the first input node 111 and the second input node 112.

The feedback circuitry 120 may comprise various passive elements in order to generate the feedback signals 107 and 108 based on the buffered signals 103 and 104. For example, the feedback circuitry 120 may comprise at least one impedance element such as at least one resistor, at least one capacitor, at least one inductor, or a combination thereof for generating the feedback signals 107 and 108 based on the buffered signals 103 and 104.

According to examples, a transfer function $T_N$ used by (of) the feedback circuitry 120 for generating the first feedback signal 107 and the second feedback signal 108 may be the inverse of a reverse isolation transfer function $T_R$ of the amplifier buffer 110. The reverse isolation transfer function $T_R$ is the transfer function of the amplifier buffer 110 for the amplifier buffer 110's reverse transmission response from the output nodes 113 and 114 to the input nodes 111 and 112. In other words, $T_N \sim -T_R$. The transfer function $T_N$ of the feedback circuitry 120 as well as the reverse isolation transfer function $T_R$ of the amplifier buffer 110 may be complex transfer functions. Accordingly, gain and phase of the feedback signals 107 and 108 may be frequency dependent.

For example, an intended, passive (=linear) and fully-differential feedback path with the transfer function $T_N(j\omega)$ may be formed from the output of an ADC buffer in a receiver to the receiver input according to the present disclosure. The proposed architecture may allow to cancel, as much as possible, the unintended, differential nonlinear kickback voltage at the signal source impedance appearing at the input of the buffer at least over a significant part of a signal frequency range of interest. In particular, if $T_N \sim -T_R$. For example, in a fully-differential ADC-buffer this may allow to cancel the odd-order harmonic content (e.g. third order harmonics or third order intermodulation distortions), which is typically the dominant harmonic distortion mechanism.

Figure 2:
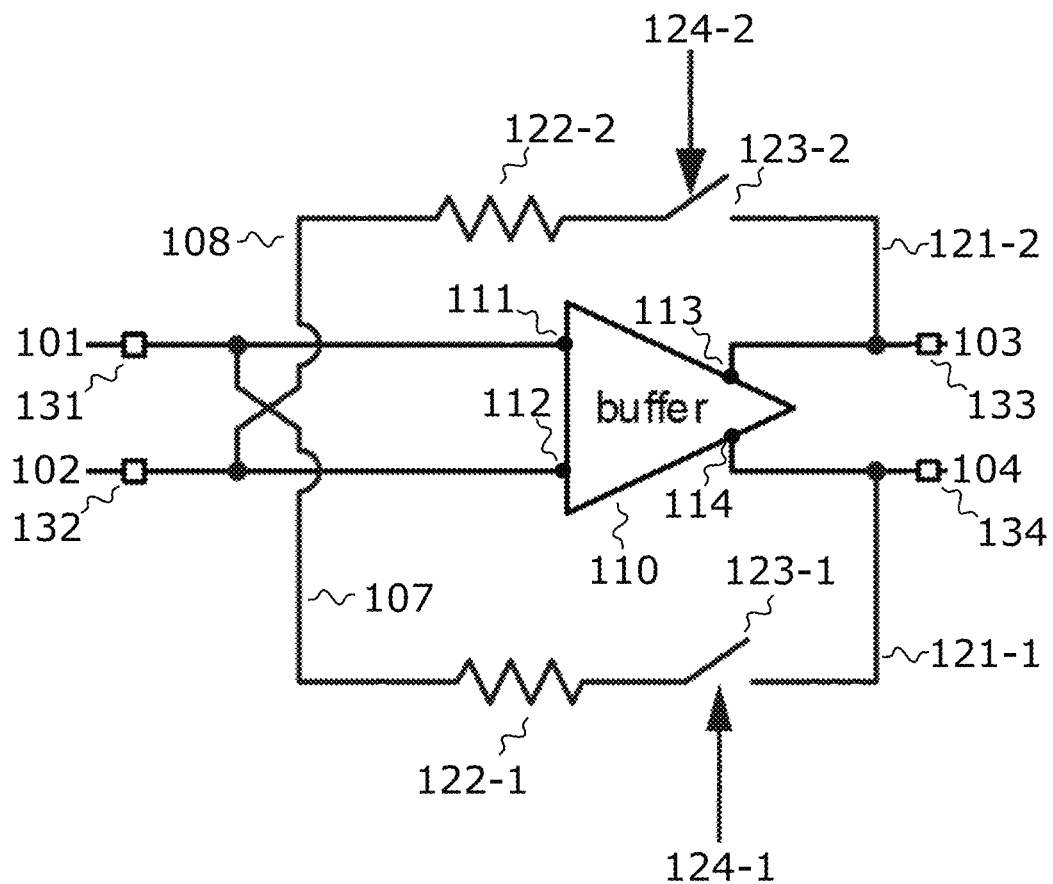
FIG. 2 illustrates a second example of an input buffer circuit.

FIG. 2 illustrates another input buffer circuit 200 with an exemplary implementation of the feedback circuitry. In the example of FIG. 2, the feedback circuitry is implemented by two coupling paths 121-1 and 121-2.

The first coupling path 121-1 is coupled between the first input node 111 of the buffer amplifier 110 and the second output node 114 of the buffer amplifier 110. The first coupling path 121-1 comprises a first impedance element 122-1 configured to generate the first feedback signal 107 based on the second buffered signal 104 using a first complex transfer function such as the above described transfer function $T_N(j\omega)$.

Analogously, the second coupling path 121-2 is coupled between the second input node 112 of the buffer amplifier 110 and the first output node 113 of the buffer amplifier 110. The second coupling path 121-2 comprises a second impedance element 122-2 configured to generate the second feedback signal 108 based on the first buffered signal 103 using a second complex transfer function such as the above described transfer function $T_N(j\omega)$. The first complex transfer function and the second complex transfer functions may be identical to each other. In other words, an impedance of the first impedance element 122-1 may be equal to an impedance of the second impedance element 122-2.

The impedance elements 122-1 and 122-2 may in general be any appropriate combination of (e.g. on-chip) passive elements (e.g. resistor, capacitor and/or inductor) that allows to match (e.g. in gain and phase) the inverse of the (e.g. frequency dependent) reverse isolation transfer function over a signal frequency range of interest. For example, each of the first impedance element 122-1 and the second impedance element 122-2 may comprise at least one resistor, at least one capacitor, at least one inductor, or a combination thereof.

The impedances of the first impedance element 122-1 and the second impedance element 122-2 may be fixed (constant), i.e. unchangeable. In other examples, the impedance of the first impedance element 122-1 and the impedance of the second impedance element 122-2 may be adjustable. For example, the first impedance element 121-1 may comprise at least one adjustable resistor configured to adjust its resistance based on a respective control signal received from circuitry external to the input buffer circuit 100, at least one adjustable capacitor configured to adjust its capacitance based on a respective control signal received from circuitry external to the input buffer circuit 100, at least one adjustable inductor configured to adjust its inductance based on a respective control signal received from circuitry external to the input buffer circuit 100, or a combination thereof. Analogously, the second impedance element 121-2 may comprise at least one adjustable resistor, at least one adjustable capacitor, at least one adjustable inductor, or a combination thereof. The circuitry external to the input buffer circuit 100 may, e.g., be control circuitry for adjusting the impedance elements 122-1 and 122-2.

The first coupling path 121-1 further comprises a first switch circuit 123-1 (e.g. a semiconductor switch such as a transistor or a pass gate) configured to selectively decouple the first impedance element 122-1 from the second output node 114 of the buffer amplifier 110. The first switch circuit 123-1 is controlled via a first control signal 124-1 received from circuitry external to the input buffer circuit 100. Analogously, the second coupling path 121-2 comprises a second switch circuit 123-2 (e.g. a semiconductor switch such as a transistor or a pass gate) configured to selectively decouple the second impedance element 122-2 from the first output node 113 of the buffer amplifier 110. The second switch circuit 123-2 is controlled via a second control signal 124-2 received from the circuitry external to the input buffer circuit 100.

The switch circuits 123-1 and 123-2 may allow to switch off the kickback neutralization completely. For example, if an attenuator (e.g. a step attenuator) providing high attenuation is preceding the input buffer circuit 100, the reverse isolation of the buffer amplifier 110 may be good enough such that no neutralization is needed. In this scenario, the kickback neutralization may even make the apparent input signal linearity worse. Hence, decoupling the impedance elements 122-1 and 122-2 from the output nodes and 113 and 114 of the buffer amplifier 110 may allow to avoid decrease of input signal linearity.

In the example of FIG. 2, the switch circuits 123-1 and 123-2 are configured to selectively decouple the impedance elements 122-1 and 122-2 from the output nodes and 113 and 114 of the buffer amplifier 110. However, it is to be noted that the present disclosure is not limited thereto. Analogously, switch circuits may be used to decouple the impedance elements 122-1 and 122-2 from the input nodes and 111 and 112 of the buffer amplifier 110 instead of the output nodes and 113 and 114.

In the example of FIG. 2, the neutralization impedances are connected in a "positive feedback" configuration such that the coupling paths 121-1 and 121-2 are non-inverting paths around the buffer amplifier 110. Because the reverse isolation represents a "passive" transfer function with considerable loss (i.e. $|T_R(j\omega)| \ll 1$) and the forward gain of the buffer amplifier 110 is typically much lower in magnitude, there is in practice no danger of instability.

In alternative examples, the neutralization impedances may be connected in a "negative feedback" configuration such that the coupling paths are inverting paths around the buffer amplifier 110. In these alternative examples, the first coupling path 121-1 would be coupled between the first input node 111 of the buffer amplifier 110 and the first output node 113 of the buffer amplifier 110. Similarly, the second coupling path 121-2 would be coupled between the second input node 112 of the buffer amplifier 110 and the second output node 114 of the buffer amplifier 110 in these alternative examples.

Figure 3:
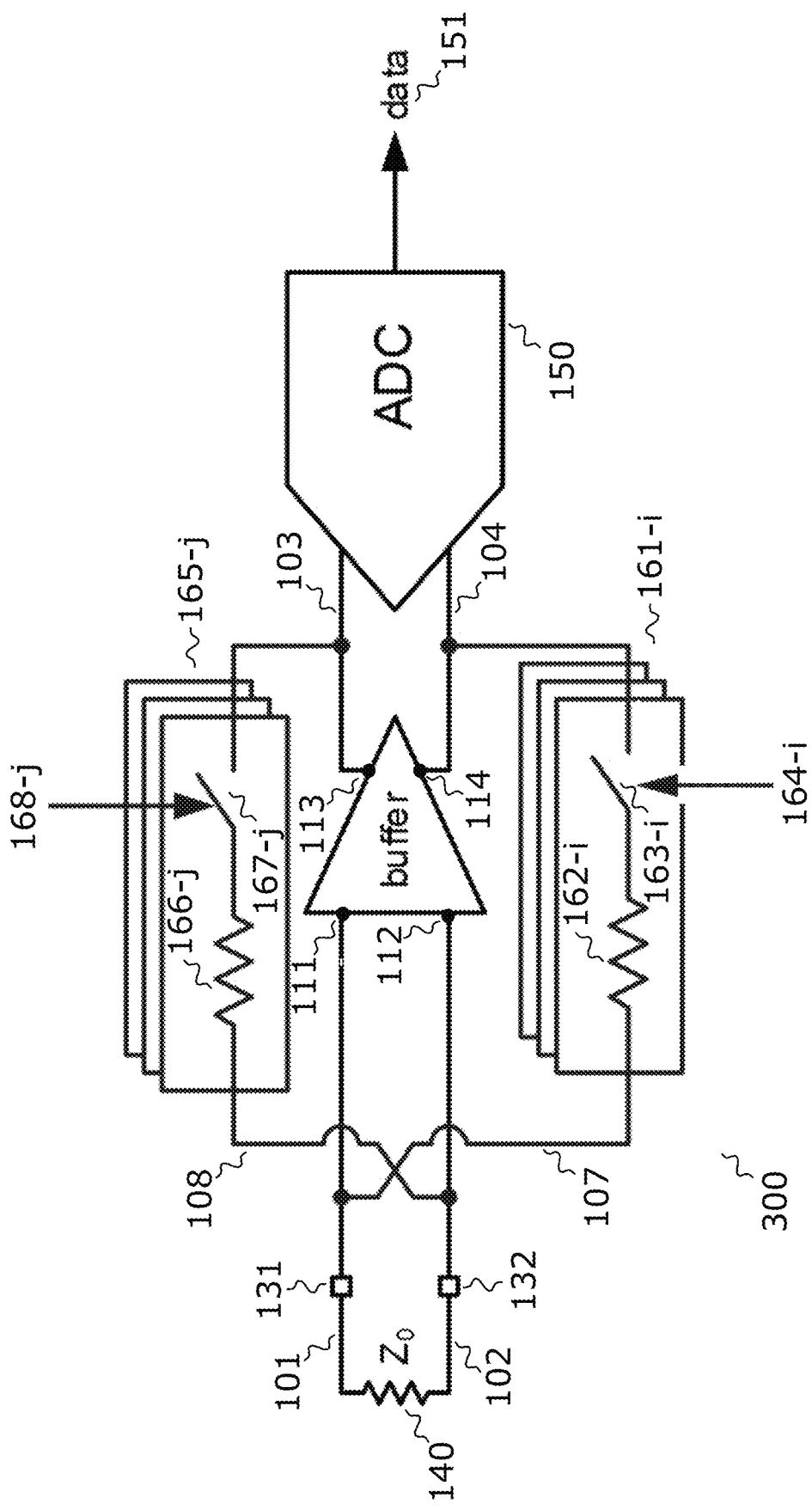
FIG. 3 illustrates a third example of an input buffer circuit.

FIG. 3 illustrates a further input buffer circuit 300 with another exemplary implementation of the feedback circuitry. In the example of FIG. 3, the feedback circuitry is implemented by two pluralities of coupling paths 161-$i$ and 165-$i$.

The plurality of first coupling paths 161-$i$ comprises N first coupling paths ($1 \leq i \leq N$) coupled in parallel between the first input node 111 of the buffer amplifier 110 and the second output node 114 of the buffer amplifier 110. Each of the plurality of first coupling paths 161-$i$ comprises a respective first impedance element 162-$i$ configured to generate a respective contribution to the first feedback signal 107 based on the second buffered signal 104 using a first complex transfer function. In other words, each of the first impedance elements 162-$i$ generates a respective first auxiliary signal. The first auxiliary signals of the first impedance elements 162-$i$ are combined (e.g. summed) to the first feedback signal 107.

Analogously, the plurality of second coupling paths 165-$j$ comprises M second coupling paths ($1 \leq j \leq M$) coupled in parallel between the second input node 112 of the buffer amplifier 110 and the first output node 113 of the buffer amplifier 110. Each of the plurality of second coupling paths comprises a respective second impedance element 166-$j$ configured to generate a respective contribution to the second feedback signal 108 based on the first buffered signal 103 using a second complex transfer function. In other words, each of the second impedance elements 166-$j$ generates a respective second auxiliary signal. The second auxiliary signals of the second impedance elements 166-$j$ are combined (e.g. summed) to the second feedback signal 108.

Similarly to what is described above, each first impedance element 162-$i$ and each second impedance element 166-$j$ comprises at least one resistor, at least one capacitor, at least one inductor or a combination thereof.

Each of the plurality of first coupling paths 161-$i$ further comprises a respective switch circuitry 163-$i$ (e.g. a semiconductor switch such as a transistor or a pass gate) configured to selectively decouple the respective first impedance element 162-$i$ from the second output node 114 of the buffer amplifier 110. The switch circuitries 163-$i$ are controlled via a respective first control signal 164-$i$ received from circuitry external to the input buffer circuit 100. Analogously, each of the plurality of second coupling paths 165-$j$ comprises a respective switch circuitry 167-$j$ (e.g. a semiconductor switch such as a transistor or a pass gate) configured to selectively decouple the respective second impedance element 166-$j$ from the first output node 113 of the buffer amplifier 110. The switch circuitries 167-$j$ are controlled via a respective second control signal 168-$j$ received from circuitry external to the input buffer circuit 100.

The first control signals 164-$i$ and the second control signals 168-$j$ may, e.g., be digital control signals such that the first coupling paths 161-$i$ and the second coupling paths 165-$j$ are controlled digitally.

The switch circuits 163-$i$ and 167-$j$ may allow change and adapt the feedback transfer function $T_N$ used for generating the first feedback signal 107 and the second feedback signal 108. By selectively adjusting (controlling) the number of the first coupling paths 161-$i$ contributing to the first feedback signal 107 and selectively adjusting (controlling) the number of second coupling paths 166-$j$ contributing to the second feedback signal 108, the effective feedback transfer function for each of the coupling paths 161-$i$ and 165-$j$ can be set. In other words, the effective transfer function $T_N$ of the feedback circuitry used for generating the first feedback signal 107 is a combination of the first complex transfer functions of the activated coupling paths 161-$i$ (with closed switch circuit 163-$i$). Analogously, the effective transfer function $T_N$ of the feedback circuitry used for generating the second feedback signal 108 is a combination of the second complex transfer functions of the activated coupling paths 165-$j$ (with closed switch circuit 167-$j$). The effective transfer functions used for generating the first feedback signal 107 and the second feedback signal 108 may be identical. For example, the feedback transfer function may be changed to provide a better match between the feedback transfer function $T_N$ and the reverse isolation transfer function $T_R$. Further, the feedback transfer function $T_N$ may be adjusted in case the reverse isolation transfer function $T_R$ is time-variant. Similarly, the feedback transfer function $T_N$ may be adjusted in case the intrinsic buffer network is changed by programming. For example, the feedback transfer function $T_N$ may be adjusted if an attenuation functionality or an amplification functionality included into the input buffer circuit 300 itself or if a setting of an attenuator or an amplifier preceding the input buffer circuit 300 is changed.

Similarly to what is described above for the input buffer circuit 200, the switch circuits 163-$i$ and 167-$j$ may allow to switch off the kickback neutralization completely.

In the example of FIG. 3, the switch circuits 163-$i$ and 167-$j$ are configured to selectively decouple the impedance elements 162-$i$ and 166-$j$ from the output nodes and 113 and 114 of the buffer amplifier 110. However, it is to be noted that the present disclosure is not limited thereto. Analogously, switch circuits may be used to decouple the impedance elements 162-$i$ and 166-$j$ from the input nodes and 111 and 112 of the buffer amplifier 110 instead of the output nodes and 113 and 114.

In the example of FIG. 3, the neutralization impedances are connected in a positive feedback configuration such that the plurality of first coupling paths 161-$i$ and the plurality of second coupling paths 165-$j$ are non-inverting paths around the buffer amplifier 110. In alternative examples, the neutralization impedances may be connected in a negative feedback configuration such that the plurality of first coupling paths and the plurality of second coupling paths are inverting paths around the buffer amplifier 110. In these alternative examples, the plurality of first coupling paths 161-$i$ would be coupled between the first input node 111 of the buffer amplifier 110 and the first output node 113 of the buffer amplifier 110. Similarly, the plurality of second coupling paths 165-$j$ would be coupled between the second input node 112 of the buffer amplifier 110 and the second output node 114 of the buffer amplifier 110 in these alternative examples.

FIG. 3 further illustrates an ADC 150 coupled to the output nodes 113 and 114 of the buffer amplifier 110. The input buffer circuit 300 buffers the differential input signals 101 and 102 for the ADC 150. The ADC 150 generates digital data 151 based on the buffered signals 103 and 104 output by the amplifier buffer 110. Further illustrated in FIG. 3 is an exemplary load impedance 140 symbolizing circuitry that provides the differential input signals 101 and 102 to the input buffer circuit 300.

Figure 4:
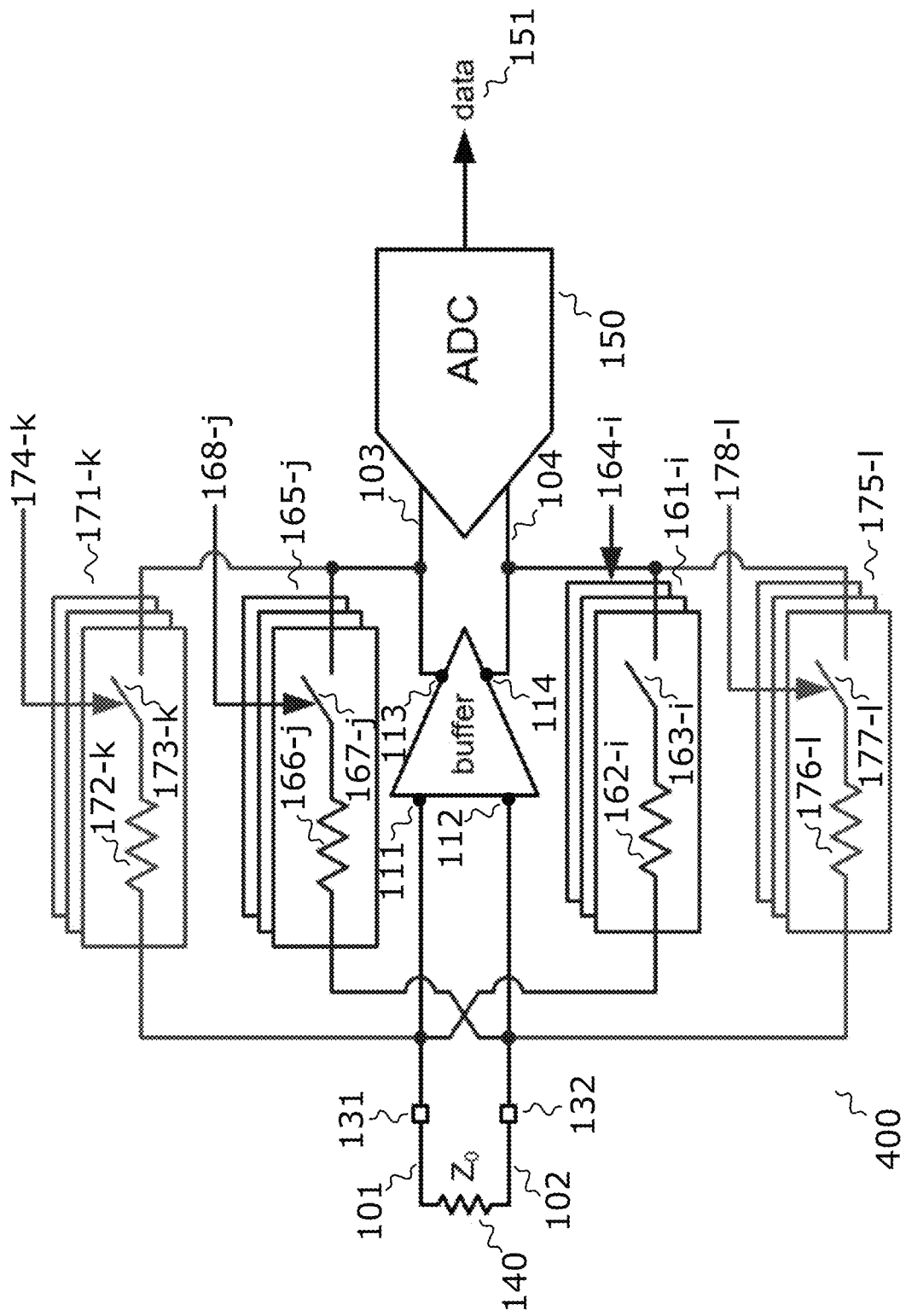
FIG. 4 illustrates a fourth example of an input buffer circuit.

FIG. 4 illustrates another input buffer circuit 400. The input buffer circuit 400 is an extended version of the input buffer circuit 300 described above. Therefore, mainly the differences between the input buffer circuit 400 and the input buffer circuit 300 will be described in the following.

In comparison to the input buffer circuit 300, the input buffer circuit 400 additionally comprises third and fourth pluralities of coupling paths 171-$k$ and 175-$l$.

The plurality of third coupling paths 171-$k$ comprises S third coupling paths (1≤k≤S) coupled in parallel between the first input node 111 of the buffer amplifier 110 and the first output node 113 of the buffer amplifier 110. Each of the plurality of third coupling paths 171-$k$ comprises a respective third impedance element 172-$k$ configured to generate a respective contribution to the first feedback signal 107 based on the first buffered signal 103 using a third complex transfer function. In other words, each of the third impedance elements 172-$k$ generates a respective third auxiliary signal. The third auxiliary signals of the third impedance elements 172-$k$ and/or the first auxiliary signals of the first impedance elements 162-$i$ are combined (e.g. summed) to the first feedback signal 107.

Analogously, the plurality of fourth coupling paths 175-$l$ comprises W fourth coupling paths (1≤l≤W) coupled in parallel between the second input node 112 of the buffer amplifier 110 and the second output node 114 of the buffer amplifier 110. Each of the plurality of second coupling paths comprises a respective fourth impedance element 176-$l$ configured to generate a respective contribution to the second feedback signal 108 based on the second buffered signal 104 using a fourth complex transfer function. In other words, each of the fourth impedance elements 176-$l$ generates a respective fourth auxiliary signal. The fourth auxiliary signals of the fourth impedance elements 176-$l$ and/or the second auxiliary signals of the second impedance elements 166-$j$ are combined (e.g. summed) to the second feedback signal 108.

Similarly to what is described above, each third impedance element 172-$l$ and each fourth impedance element 176-$l$ comprises at least one resistor, at least one capacitor, at least one inductor or a combination thereof.

Each of the plurality of third coupling paths 171-$k$ further comprises a respective switch circuitry 173-$k$ (e.g. a semiconductor switch such as a transistor or a pass gate) configured to selectively decouple the respective third impedance element 172-$k$ from the first output node 113 of the buffer amplifier 110. The switch circuitries 173-$k$ are controlled via a respective first control signal 174-$k$ received from circuitry external to the input buffer circuit 100. Analogously, each of the fourth coupling paths 175-$l$ comprises a respective switch circuitry 177-$l$ (e.g. a semiconductor switch such as a transistor or a pass gate) configured to selectively decouple the respective fourth impedance element 176-$l$ from the second output node 114 of the buffer amplifier 110. The switch circuitries 177-$l$ are controlled via a respective second control signal 178-$l$ received from circuitry external to the input buffer circuit 100.

The third control signals 174-$k$ and the fourth control signals 178-$l$ may, e.g., be digital control signals such that the third coupling paths 171-$k$ and the fourth coupling paths 175-$l$ are controlled digitally.

In the example of FIG. 4, the switch circuits 173-$k$ and 177-$l$ are configured to selectively decouple the impedance elements 172-$k$ and 176-$l$ from the output nodes and 113 and 114 of the buffer amplifier 110. However, it is to be noted that the present disclosure is not limited thereto. Analogously, switch circuits may be used to decouple the impedance elements 172-$k$ and 176-$l$ from the input nodes and 111 and 112 of the buffer amplifier 110 instead of the output nodes and 113 and 114.

In the example of FIG. 4, part of the neutralization impedances is connected in a positive feedback configuration while the other part of the neutralization impedances is connected in a negative feedback configuration. Accordingly, inverting and non-inverting coupling paths around the buffer amplifier 110 are provided.

The switch circuits 163-$i$, 167-$j$, 173-$k$ and 177-$l$ may allow to change and adapt the feedback transfer function $T_N$ used for generating the first feedback signal 107 and the second feedback signal 108.

The effective transfer function $T_N$ of the feedback circuitry used for generating the first feedback signal 107 is a combination of the first complex transfer functions of the activated coupling paths 161-$i$ (with closed switch circuit 163-$i$) and the third complex transfer functions of the activated coupling paths 171-$i$ (with closed switch circuit 173-$k$). Analogously, the transfer function $T_N$ of the feedback circuitry used for generating the second feedback signal 108 is a combination of the second complex transfer functions of the activated coupling paths 165-*j* (with closed switch circuit 167-*j*) and the fourth complex transfer functions of the activated coupling paths 175-*j* (with closed switch circuit 177-*l*). The effective transfer functions used for generating the first feedback signal 107 and the second feedback signal 108 may be identical.

Further, the switch circuits 163-*i*, 167-*j*, 173-*k* and 177-*l* may allow to switch off the kickback neutralization completely.

Figure 5:
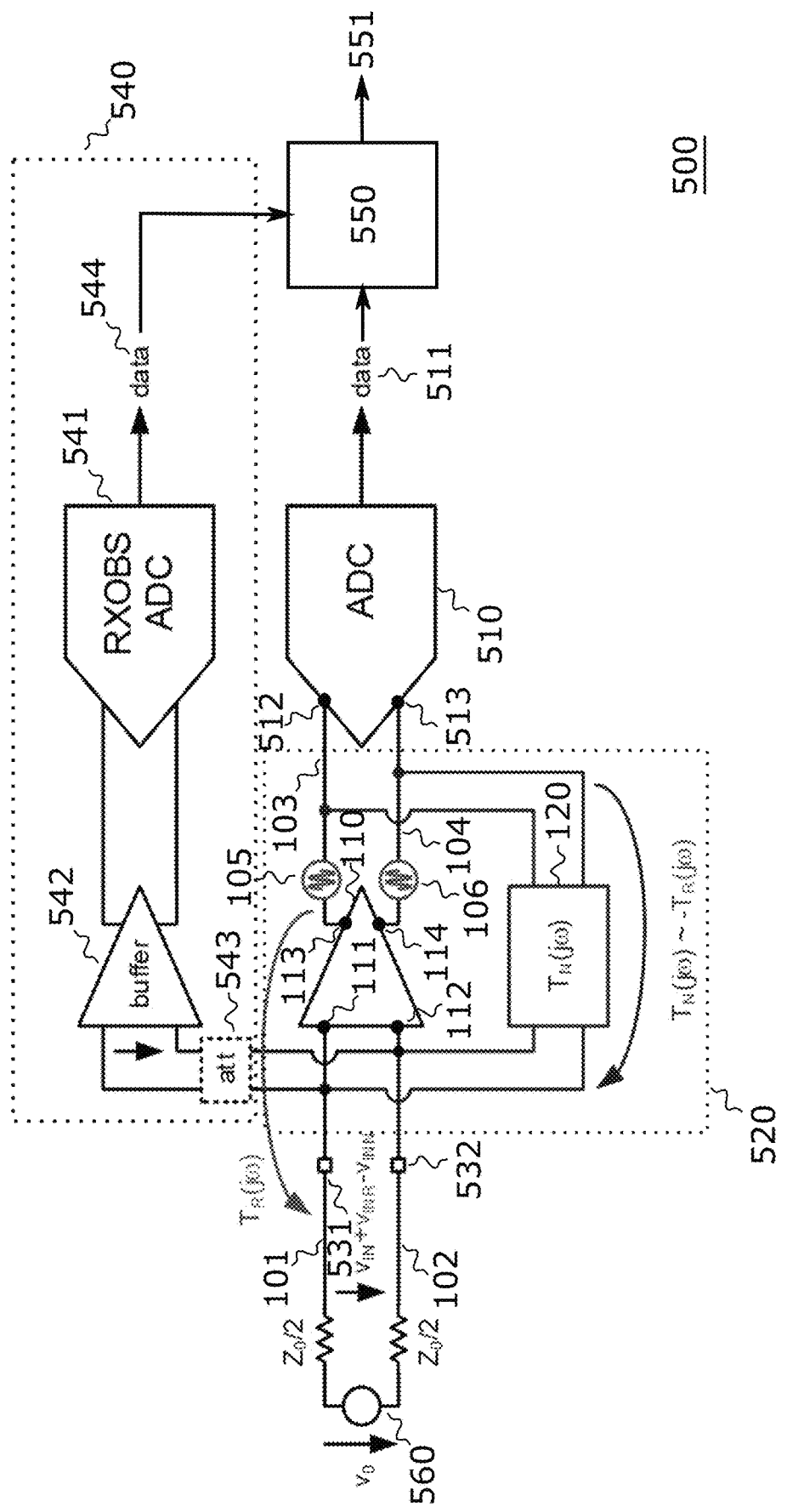
FIG. 5 illustrates a first example of an ADC system.

FIG. 5 illustrates an example of an ADC system 500 that uses an input buffer circuit according to the present disclosure.

The ADC system 500 comprises an ADC 510. A signal source 560 (e.g. an antenna or an RF front-end) provides a first input signal 101 and a signal input 102 for the ADC 510. The first input signal 101 and the signal input 102 form a differential signal pair. A first input node 531 of the ADC system 500 and a second input node 532 of the ADC system 500 couple to the signal source 560 for receiving the first input signal 101 and the signal input 102. An input buffer circuit 520 according to one or more aspects of the architecture described above in connection with FIGS. 1 to 4 or one or more examples described above in connection with FIGS. 1 to 4 is coupled between the input nodes 531 and 532 of the ADC system 500 and the ADC 510. In other words, the input buffer circuit 520 is coupled between the signal source 560 and the ADC 510 for buffering the input signals 101 and 102.

The first input node of the input buffer circuit 520 is coupled to the first input node 531 of the ADC system for receiving the first input signal 101. Analogously, the second input node of the input buffer circuit 520 is coupled to the second input node 532 of the ADC system 500 for receiving the second input signal 102.

A first input node 512 of the ADC 510 is coupled to the first output node 113 of the buffer amplifier 110 for receiving the first buffered signal 103. Analogously, a second input node 513 of the ADC 510 is coupled to the second output node 114 of the buffer amplifier 110 for receiving the second buffered signal 104. The ADC 510 generates digital data 511 based on the buffered signals 103 and 104, i.e. based on the first input signal 101 and the second input signal 102.

The ADC system 500 further comprises an observation path 540 coupled to the first input node 531 and the second input node 532 of the ADC system for receiving the first input signal 101 and the second input signal 102. The observation path 540 comprises an observation ADC 541 configured to generate further digital data 544 based on the first input signal 101 and the second input signal 102. The further digital data 544 is used for controlling an equalizer 550 of the ADC system 500 that equalizes the digital data 511 output by the ADC 510. In particular, the observation ADC 541 is used as a reference data channel for digital post-equalization of the ADC 510's digital data 511.

The equalizer 550 is configured to generate an equalized output signal 551 of the ADC system based on the digital data 511 generated by the ADC. The equalizer 550 is configured to adjust, based on the further digital data 544 generated by the observation ADC 541, at least one equalization parameter used for generating the equalized output signal 551. For example, the equalizer 550 may use (employ) a nonlinear function optimized to reduce the nonlinearity of the buffer amplifier 110 and/or the ADC 510. In this case, the equalizer 550 may be a nonlinear equalizer, whose parameters are trained based on the—assumed perfectly linear—digital data 544 (i.e. the observation path output).

A sampling rate of the observation ADC 541 is lower than a sampling rate of the ADC 510. The observation path 540 may optionally further comprise an attenuator 543 for attenuating the first input signal 101 and the second input signal 102 and an input buffer 542, which are coupled between the observation ADC 541 and the input nodes 531 and 532 of the ADC system 500. Since the achievable linearity of the post-equalized ADC 510 is limited by the linearity of the observation ADC 541 (which is the signal reference), the attenuator 543 may allow to improve the linearity of the observation ADC 541 at the expense of reduced dynamic range, i.e. an increased noise floor relative to the input signals 101 and 102.

As the input buffer circuit 520 allows to mitigate or neutralize the respective unwanted signal component at the input nodes 111 and 112 of the buffer amplifier 110, which are caused due to the finite reverse isolation of the buffer amplifier 110, cross-modulation with the actual wanted input signals 101 and 102 may be avoided such that the observation path 540 is not negatively affected. Therefore, the input buffer circuit 520 may allow to substantially improves the achievable linearity in the observation path 540 and, hence, linearity of the post-equalized ADC 510.

The ADC system 500 may optionally further comprise control circuitry (not illustrated) configured to control operation of the feedback circuitry 120 based on an operational parameter of the buffer amplifier 110. For example, the transfer function of feedback circuitry 120 may be adjusted based on an attenuation setting or an amplification setting of the buffer amplifier 110.

Figure 6:
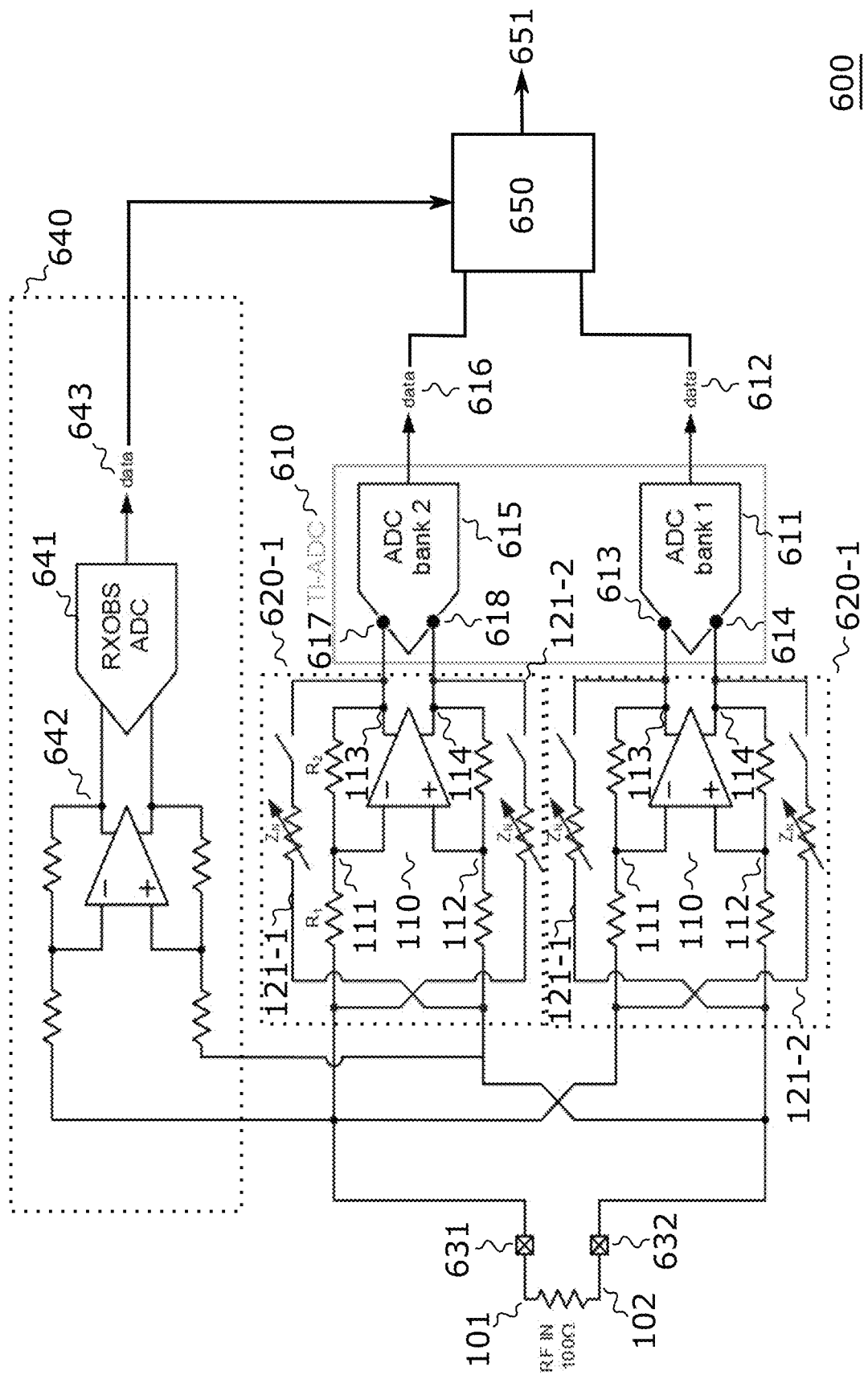
FIG. 6 illustrates a second example of an ADC system.

FIG. 6 illustrates another ADC system 600 that uses input buffer circuits according to the present disclosure. In contrast to the ADC system 500, the ADC system 600 uses time-interleaved ADCs 611 and 615 instead of a single ADC. The time-interleaved ADCs 611 and 615 may be understood as sub-ADCs of a time-interleaved ADC 610. It is to be noted that the present disclosure is not limited to systems using two time-interleaved ADCs. In general any number H≥2 of time-interleaved ADCs may be used. In the example of FIG. 6, two ADCs are illustrated for reasons of simplicity.

Similar to what is described above, a first input node 631 of the ADC system 600 and a second input node 632 of the ADC system 600 receive a first input signal 101 and a signal input 102 from a signal source. A respective input buffer circuit 620-1 and 620-2 according to one or more aspects of the architecture described above in connection with FIGS. 1 to 4 or one or more examples described above in connection with FIGS. 1 to 4 is coupled between the first input node 631 and the second input node 632 of the ADC system and each of the time-interleaved ADCs 611 and 615. In other words, a respective input buffer circuit 620-1, 620-2 is coupled between the signal source and each of the time-interleaved ADCs 611 and 615 for buffering the input signals 101 and 102.

The first input node 111 of the respective buffer amplifier 110 of each of the input buffer circuits 620-1 and 620-2 is coupled to the first input node 631 of the ADC system 600 for receiving the first input signal 101. Analogously, the second input node 112 of the respective buffer amplifier 110 of each of the input buffer circuit 620-1 and 620-2 is coupled to the second input node 632 of the ADC system 600 for receiving the second input signal 102. In the example of FIG. 6, the respective buffer amplifier 110 of the input buffer circuit 620-1 and 620-2 is a fully-differential unity gain feedback amplifier.

A first input node 613 of the ADC 611 is coupled to the first output node 113 of the buffer amplifier 110 of the input buffer circuit 620-1 for receiving the first buffered signal. Analogously, a second input node 614 of the ADC 611 is coupled to the second output node 114 of the buffer amplifier 110 of the input buffer circuit 620-1 for receiving the second buffered signal. The input nodes 617 and 618 of the ADC 615 are analogously coupled to the output nodes 113 and 114 of the buffer amplifier 110 of the input buffer circuit 620-2. The ADCs 611 and 615 respectively generate digital data 612 and 616 based on the buffered signals of their respective input buffer circuit, i.e. based on the first input signal 101 and the second input signal 102.

The ADC system 600 further comprises an observation path 640 coupled to the first input node 631 and the second input node 632 of the ADC system 600 for receiving the first input signal 101 and the second input signal 102. The observation path 640 comprises an observation ADC 641 configured to generate further digital data 643 based on the first input signal 101 and the second input signal 102. The further digital data 643 is used for controlling an equalizer 650 of the ADC system 600 that combines and equalizes the pieces of digital data 612 and 616 output by the time-interleaved ADCs 611 and 615.

The equalizer 650 is configured to generate an equalized output signal 651 of the ADC system 600 based on the digital data 612 and the digital data 616 generated by the time-interleaved ADCs 611 and 615. The equalizer 650 is configured to adjust, based on the further digital data 643 generated by the observation ADC 641, at least one equalization parameter used for generating the equalized output signal 651.

Similarly to what is described above, the observation path 640 may comprise further elements such as an input buffer 642 for the observation ADC 641. The input buffer 642 is a fully-differential unity gain feedback amplifier. The attenuation in the observation path 640 may be realized by increasing the value of the input resistors. Optionally, the input and feedback resistors of the input buffer 642 may be made variable to implement a step attenuator or variable gain functionality. A sampling rate of the observation ADC 641 is lower than sampling rates of the time-interleaved ADCs 611 and 615.

Similarly to what is described above for the ADC system 500, the input buffer circuits 620-1 and 620-2 may allow to mitigate or neutralize the respective unwanted signal component at the input nodes 111 and 112 of their buffer amplifier 110 that is caused due to the finite reverse isolation of the respective buffer amplifier 110. Accordingly, the input buffer circuits 620-1 and 620-2 may allow to substantially improve the achievable linearity in the observation path 640 and, hence, linearity of the post-equalized ADCs 611 and 615.

Optionally, the ADC system 600 may further comprise control circuitry (not illustrated) configured to control operation of the respective feedback circuitry 120 (e.g. adjust the transfer function of the respective feedback circuitry 120) of the input buffer circuits 620-1 and 620-2 based on an operational parameter of the respective buffer amplifier 110 of the input buffer circuits 620-1 and 620-2. For example, the transfer function of the respective feedback circuitry 120 may be adjusted based on an attenuation setting or amplification setting of the respective buffer amplifier 110 of the input buffer circuits 620-1 and 620-2.

In other words, FIG. 6 illustrates a time-interleaved ADC with an observation path and a variable passive kickback neutralization network. A possibly complex (and possibly variable) impedance network $Z_N$ may provide a fully-differential (e.g. using two identical $Z_N$ branches) neutralization feedback impedance that ideally matches the inverse of the (in general) frequency dependent (=complex) reverse isolation transfer function $T_R$, separately for each buffer (in general H buffers driving H sub-ADC banks).

Figure 7:
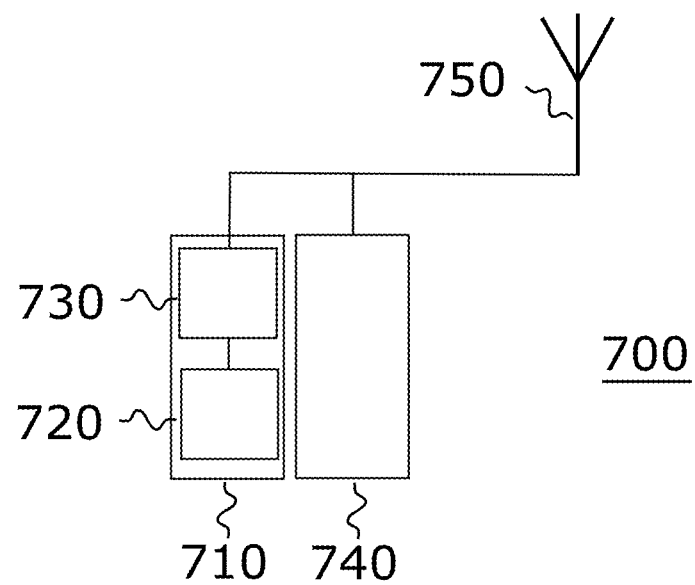
FIG. 7 illustrates an example of a base station.

An example of an implementation using input buffering according to one or more aspects of the architecture described above in connection with FIGS. 1 to 6 or one or more examples described above in connection with FIGS. 1 to 6 is illustrated in FIG. 7. FIG. 7 schematically illustrates an example of a radio base station 700 (e.g. for a femtocell, a picocell, a microcell or a macrocell) comprising an ADC system 720 as proposed.

A receiver 710 of the base station 700 comprises the ADC system 720. The receiver 710 additionally comprises analog circuitry 730 configured to receive an RF receive signal from at least one antenna element 750 of the base station 700. The analog circuitry 730 is further configured to supply the first input signal and the second input signal to the ADC system 720 based on the RF receive signal. The ADC system 720 generates digital data based on the first input signal and the second input signal. For example, the analog circuitry 730 may be an analog RF front-end and comprising one or more of a Low-Noise Amplifier (LNA), filter, a down-conversion mixer, ElectroStatic Discharge (ESD) protection circuitry, an attenuator etc.

Further, the base station 700 comprises a transmitter 740 configured to generate an RF transmit signal. The transmitter 740 may use the antenna element 750 or another antenna element (not illustrated) of the base station 700 for radiating the RF transmit signal to the environment.

To this end, a base station with improved analog-to-digital conversion capabilities may be provided.

The base station 700 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 8:
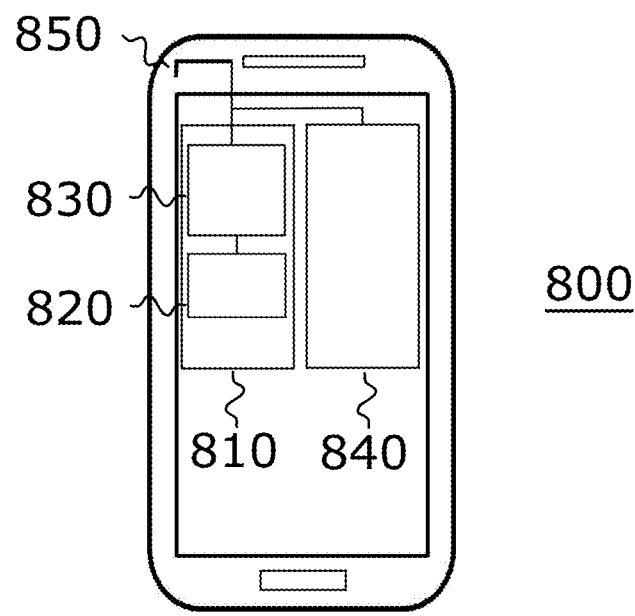
FIG. 8 illustrates an example of a mobile device.

Another example of an implementation using input buffering according to one or more aspects of the architecture described above in connection with FIGS. 1 to 6 or one or more examples described above in connection with FIGS. 1 to 6 is illustrated in FIG. 8. FIG. 8 schematically illustrates an example of a mobile device 800 (e.g. mobile phone, smartphone, tablet-computer, or laptop) comprising an ADC system 820 as proposed.

A receiver 810 of the mobile device 800 comprises the ADC system 820. The receiver 810 additionally comprises analog circuitry 830 configured to receive an RF receive signal from at least one antenna element 850 of the mobile device 800. The analog circuitry 830 is further configured to supply the first input signal and the second input signal to the ADC system 820 based on the RF receive signal. The ADC system 820 generates digital data based on the first input signal and the second input signal. For example, the analog circuitry 830 may be an analog RF front-end and comprise one or more of a LNA, a filter, a down-conversion mixer, ESD protection circuitry, an attenuator etc.

Further, the mobile device 800 comprises a transmitter 840 configured to generate an RF transmit signal. The transmitter 840 may use the antenna element 850 or another antenna element (not illustrated) of the mobile device 800 for radiating the RF transmit signal to the environment.

To this end, a mobile device with improved analog-to-digital conversion capabilities may be provided.

The mobile device 800 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I$^2$C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using input buffering according to the proposed architecture or one or more of the examples described above may be configured to operate according to one of the 3rd Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

However, it is to be noted that the proposed ADC system may be used not only in receivers for wireless signals. The proposed ADC system may, for example, be used for high precision instrumentation or wireline receivers as well. Therefore, examples of the present disclosure further relate to a receiver comprising an ADC system as proposed herein and analog circuitry configured to receive a receive signal from a wired transmission link. The analog circuitry is configured to supply the first input signal and the second input signal to the ADC system based on the receive signal. For example, the analog circuitry may comprise one or more of a LNA, a filter, a down-conversion mixer, ESD protection circuitry, an attenuator etc. Further, examples relate to any electronic device comprising the proposed ADC system.

Figure 9:
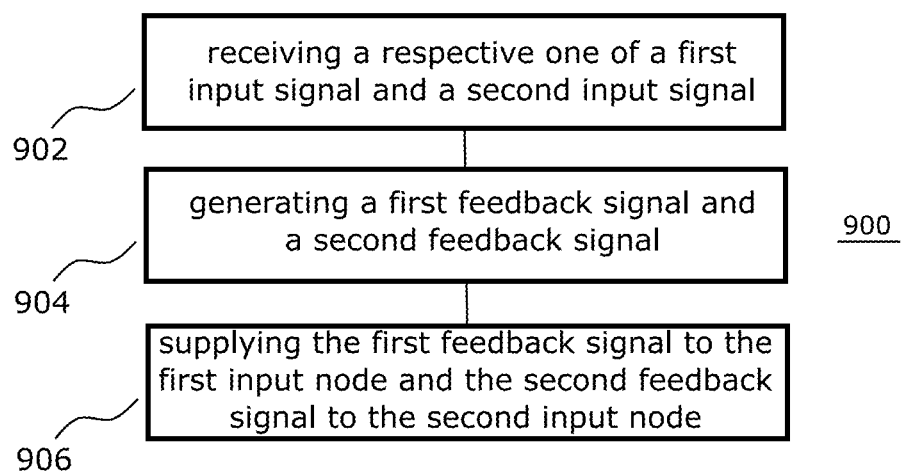
FIG. 9 illustrates a flowchart of an example of a method for operating an input buffer circuit.

For further illustrating the input buffering described above, FIG. 9 illustrates a flowchart of method 900 for operating an input buffer circuit for an ADC. The method 900 comprises receiving 902 a respective one of a first input signal and a second input signal at a first input node and a second input node of an amplifier buffer of the input buffer circuit. The first input signal and the second input signal form a differential input signal pair for the ADC. Additionally, the method 900 comprises generating 904, by feedback circuitry and based on the first buffered signal and the second buffered signal, a first feedback signal and a second feedback signal for mitigating a respective unwanted signal component at the first input node and the second input node related to a limited reverse isolation of the amplifier buffer. The method 900 further comprises supplying 906 the first feedback signal to the first input node and the second feedback signal to the second input node by the feedback circuitry.

A transfer function used for generating 904 the first feedback signal and the second feedback signal may be the inverse of a reverse isolation transfer function of the amplifier buffer.

The method 900 may allow to neutralize the unwanted signal components at the first input node and the second input node. Accordingly, negative effects of the amplifier buffer's limited reverse isolation on circuitry preceding the input buffer circuit may be avoided.

More details and aspects of the method 900 are explained in connection with the proposed technique or one or more examples described above (e.g. FIGS. 1 to 6). The method 900 may comprise one or more additional optional features corresponding to one or more aspects of the proposed technique or one or more examples described above.

The examples described herein may be summarized as follows:

Example 1 is an input buffer circuit for an analog-to-digital converter, the input buffer circuit comprising: a buffer amplifier comprising: a first input node and a second input node each configured to receive a respective one of a first input signal and a second input signal forming a differential input signal pair for the analog-to-digital converter; and a first output node and a second output node each configured to output a respective one of a first buffered signal and a second buffered signal; and feedback circuitry configured to: generate, based on the first buffered signal and the second buffered signal, a first feedback signal and a second feedback signal for mitigating a respective unwanted signal component at the first input node and the second input node related to a limited reverse isolation of the amplifier buffer; and supply the first feedback signal to the first input node and the second feedback signal to the second input node.

Example 2 is the input buffer circuit of example 1, wherein a transfer function used by the feedback circuitry for generating the first feedback signal and the second feedback signal is the inverse of a reverse isolation transfer function of the amplifier buffer.

Example 3 is the input buffer circuit of example 1 or example 2, wherein the feedback circuitry comprises: a first coupling path coupled between the first input node and one of the first output node and the second output node, wherein the first coupling path comprises a first impedance element configured to generate the first feedback signal based on one of the first buffered signal and the second buffered signal using a first complex transfer function; and a second coupling path coupled between the second input node and the other one of the first output node and the second output node, wherein the second coupling path comprises a second impedance element configured to generate the second feedback signal based on the other one of the first buffered signal and the second buffered signal using a second complex transfer function.

Example 4 is the input buffer circuit of example 3, wherein an impedance of the first impedance element is equal to an impedance of the second impedance element.

Example 5 is the input buffer circuit of example 3 or example 4, wherein impedances of the first impedance element and the second impedance element are fixed.

Example 6 is the input buffer circuit of any of examples 3 to 5, wherein each of the first impedance element and the second impedance element comprises at least one resistor, at least one capacitor, at least one inductor or a combination thereof Example 7 is the input buffer circuit of example 3 or example 4, wherein an impedance of the first impedance element and an impedance of the second impedance element are adjustable.

Example 8 is the input buffer circuit of example 7, wherein the first impedance element comprises at least one adjustable resistor configured to adjust its resistance based on a respective control signal received from circuitry external to the input buffer circuit, at least one adjustable capacitor configured to adjust its capacitance based on a respective control signal received from circuitry external to the input buffer circuit, at least one adjustable inductor configured to adjust its inductance based on a respective control signal received from circuitry external to the input buffer circuit, or a combination thereof.

Example 9 is the input buffer circuit of any of examples 3 to 8, wherein the first coupling path comprises a first switch circuit configured to selectively decouple, based on a first control signal received from circuitry external to the input buffer circuit, the first impedance element from the first input node or the one of the first output node and the second output node, and wherein the second coupling path comprises a second switch circuit configured to selectively decouple, based on a second control signal received from circuitry external to the input buffer circuit, the second impedance element from the second input node or the other one of the first output node and the second output node.

Example 10 is the input buffer circuit of example 1 or example 2, wherein the feedback circuitry comprises: a plurality of first coupling paths coupled in parallel between the first input node and one of the first output node and the second output node, wherein each of the plurality of first coupling paths comprises a respective first impedance element configured to generate a respective contribution to the first feedback signal based on one of the first buffered signal and the second buffered signal using a first complex transfer function, wherein each of the plurality of first coupling paths comprises a respective switch circuitry configured to selectively decouple, based on a respective first control signal received from circuitry external to the input buffer circuit, the respective first impedance element from the first input node or the one of the first output node and the second output node.

Example 11 is the input buffer circuit of example 10, wherein each first impedance element comprises at least one resistor, at least one capacitor, at least one inductor or a combination thereof.

Example 12 is the input buffer circuit of example 10 or example 11, wherein the feedback circuitry further comprises: a plurality of second coupling paths coupled in parallel between the second input node and the other one of the first output node and the second output node, wherein each of the plurality of second coupling paths comprises a respective second impedance element configured to generate a respective contribution to the second feedback signal based on the other one of the first buffered signal and the second buffered signal using a second complex transfer function, wherein each of the plurality of second coupling paths comprises a respective switch circuitry configured to selectively decouple, based on a respective second control signal received from circuitry external to the input buffer circuit, the respective second impedance element from the second input node or the other one of the first output node and the second output node.

Example 13 is the input buffer circuit of any of examples 10 to 12, wherein the feedback circuitry further comprises: a plurality of third coupling paths coupled in parallel between the first input node and the other one of the first output node and the second output node, wherein each of the plurality of third coupling paths comprises a respective third impedance element configured to generate a respective contribution to the first feedback signal based on the other one of the first buffered signal and the second buffered signal using a third complex transfer function, wherein each of the plurality of third coupling paths comprises a respective switch circuitry configured to selectively decouple, based on a respective third control signal received from circuitry external to the input buffer circuit, the respective third impedance element from the first input node or the other one of the first output node and the second output node.

Example 14 is the input buffer circuit of any of examples 10 to 13, wherein the feedback circuitry further comprises: a plurality of fourth coupling paths coupled in parallel between the second input node and the one of the first output node and the second output node, wherein each of the plurality of fourth coupling paths comprises a respective fourth impedance element configured to generate a respective contribution to the second feedback signal based on the one of the first buffered signal and the second buffered signal using a fourth complex transfer function, wherein each of the plurality of fourth coupling paths comprises a respective switch circuitry configured to selectively decouple, based on a respective fourth control signal received from circuitry external to the input buffer circuit, the respective fourth impedance element from the second input node or the one of the first output node and the second output node.

Example 15 is the input buffer circuit of any of examples 1 to 14, wherein the amplifier buffer is configured to: generate the first buffered signal based on the first input signal; and generate the second buffered signal based on the second input signal.

Example 16 is an analog-to-digital converter, ADC, system, comprising: an input buffer circuit according to any of examples 1 to 15, wherein the first input node of the buffer amplifier is coupled to a first input node of the ADC system for receiving the first input signal, and wherein the second input node of the buffer amplifier is coupled to a second input node of the ADC system for receiving the second input signal; and an ADC configured to generate digital data based on the first input signal and the second input signal, wherein a first input node of the ADC is coupled to the first output node of the buffer amplifier for receiving the first buffered signal, and wherein a second input node of the ADC is coupled to the second output node of the buffer amplifier for receiving the second buffered signal.

Example 17 is the ADC system of example 16, further comprising: a plurality of further ADCs each configured to generate respective digital data based on the first input signal and the second input signal, wherein the ADC and the plurality of further ADCs are time-interleaved.

Example 18 is the ADC system of example 17, wherein a respective input buffer circuit according to any of examples 1 to 15 is coupled between the first input node and the second input node of the ADC system and each of the plurality of further ADCs.

Example 19 is the ADC system of any of examples 16 to 18, further comprising: an observation path coupled to the first input node and the second input node of the ADC system for receiving the first input signal and the second input signal, wherein the observation path comprises an observation ADC configured to generate further digital data based on the first input signal and the second input signal; and an equalizer configured to generate an equalized output signal of the ADC system based on the digital data generated by the ADC, wherein the equalizer is configured to adjust, based on the further digital data generated by the observation ADC, at least one equalization parameter used for generating the equalized output signal of the ADC system.

Example 20 is the ADC system of example 19, wherein a sampling rate of the observation ADC is lower than sampling rate of the ADC.

Example 21 is the ADC system of any of examples 16 to 20, further comprising control circuitry configured to control operation of the feedback circuitry based on an operational parameter of the buffer amplifier.

Example 22 is a receiver, comprising: an analog-to-digital converter system according to any of examples 16 to 21; and analog circuitry configured to receive a receive signal, and to supply the first input signal and the second input signal to the analog-to-digital converter system based on the receive signal.

Example 23 is the receiver of example 22, wherein the receive signal is a radio frequency receive signal from an antenna element.

Example 24 is the receiver of example 22, wherein the analog circuitry is configured to receive the receive signal from a wired transmission link.

Example 25 is a base station, comprising: a receiver according to example 22 or example 23; and a transmitter configured to generate a radio frequency transmit signal.

Example 26 is the base station of example 25, further comprising at least one antenna element coupled to at least one of the receiver and the transmitter.

Example 27 is a mobile device, comprising: a receiver according to example 22 or example 23; and a transmitter configured to generate a radio frequency transmit signal.

Example 28 is the mobile device of example 27, further comprising at least one antenna element coupled to at least one of the receiver and the transmitter.

Example 29 is a method for operating an input buffer circuit for an analog-to-digital converter, the method comprising: receiving a respective one of a first input signal and a second input signal, which form a differential input signal pair for the analog-to-digital converter, at a first input node and a second input node of an amplifier buffer of the input buffer circuit; generating, by feedback circuitry and based on the first buffered signal and the second buffered signal, a first feedback signal and a second feedback signal for mitigating a respective unwanted signal component at the first input node and the second input node related to a limited reverse isolation of the amplifier buffer; and supplying the first feedback signal to the first input node and the second feedback signal to the second input node by the feedback circuitry.

Example 30 is the method of example 29, wherein a transfer function used for generating the first feedback signal and the second feedback signal is the inverse of a reverse isolation transfer function of the amplifier buffer.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An input buffer circuit for an analog-to-digital converter, the input buffer circuit comprising:
   a buffer amplifier comprising:
      a first input node and a second input node each configured to receive a respective one of a first input signal and a second input signal forming a differential input signal pair for the analog-to-digital converter; and
      a first output node and a second output node each configured to output a respective one of a first buffered signal and a second buffered signal; and
   feedback circuitry configured to:
      generate, based on the first buffered signal and the second buffered signal, a first feedback signal and a second feedback signal for mitigating a respective unwanted signal component at the first input node and the second input node related to a limited reverse isolation of the amplifier buffer; and
      supply the first feedback signal to the first input node and the second feedback signal to the second input node.

2. The input buffer circuit of claim 1, wherein a transfer function used by the feedback circuitry for generating the first feedback signal and the second feedback signal is the inverse of a reverse isolation transfer function of the amplifier buffer.

3. The input buffer circuit of claim 1, wherein the feedback circuitry comprises:
   a first coupling path coupled between the first input node and one of the first output node and the second output node, wherein the first coupling path comprises a first impedance element configured to generate the first feedback signal based on one of the first buffered signal and the second buffered signal using a first complex transfer function; and
   a second coupling path coupled between the second input node and the other one of the first output node and the second output node, wherein the second coupling path comprises a second impedance element configured to generate the second feedback signal based on the other one of the first buffered signal and the second buffered signal using a second complex transfer function.

4. The input buffer circuit of claim 3, wherein an impedance of the first impedance element is equal to an impedance of the second impedance element.

5. The input buffer circuit of claim 3, wherein impedances of the first impedance element and the second impedance element are fixed.

6. The input buffer circuit of claim 3, wherein each of the first impedance element and the second impedance element comprises at least one resistor, at least one capacitor, at least one inductor or a combination thereof.

7. The input buffer circuit of claim 3, wherein an impedance of the first impedance element and an impedance of the second impedance element are adjustable.

8. The input buffer circuit of claim 7, wherein the first impedance element comprises at least one adjustable resistor configured to adjust its resistance based on a respective control signal received from circuitry external to the input buffer circuit, at least one adjustable capacitor configured to adjust its capacitance based on a respective control signal received from circuitry external to the input buffer circuit, at least one adjustable inductor configured to adjust its inductance based on a respective control signal received from circuitry external to the input buffer circuit, or a combination thereof.

9. The input buffer circuit of claim 3, wherein the first coupling path comprises a first switch circuit configured to selectively decouple, based on a first control signal received from circuitry external to the input buffer circuit, the first impedance element from the first input node or the one of the first output node and the second output node, and wherein the second coupling path comprises a second switch circuit configured to selectively decouple, based on a second control signal received from circuitry external to the input buffer circuit, the second impedance element from the second input node or the other one of the first output node and the second output node.

10. The input buffer circuit of claim 1, wherein the feedback circuitry comprises:
   a plurality of first coupling paths coupled in parallel between the first input node and one of the first output node and the second output node, wherein each of the plurality of first coupling paths comprises a respective first impedance element configured to generate a respective contribution to the first feedback signal based on one of the first buffered signal and the second buffered signal using a first complex transfer function, wherein each of the plurality of first coupling paths comprises a respective switch circuitry configured to selectively decouple, based on a respective first control signal received from circuitry external to the input buffer circuit, the respective first impedance element from the first input node or the one of the first output node and the second output node.

11. The input buffer circuit of claim 10, wherein each first impedance element comprises at least one resistor, at least one capacitor, at least one inductor or a combination thereof.

12. The input buffer circuit of claim 10, wherein the feedback circuitry further comprises:

a plurality of second coupling paths coupled in parallel between the second input node and the other one of the first output node and the second output node, wherein each of the plurality of second coupling paths comprises a respective second impedance element configured to generate a respective contribution to the second feedback signal based on the other one of the first buffered signal and the second buffered signal using a second complex transfer function, wherein each of the plurality of second coupling paths comprises a respective switch circuitry configured to selectively decouple, based on a respective second control signal received from circuitry external to the input buffer circuit, the respective second impedance element from the second input node or the other one of the first output node and the second output node.

13. The input buffer circuit of claim 10, wherein the feedback circuitry further comprises:

a plurality of third coupling paths coupled in parallel between the first input node and the other one of the first output node and the second output node, wherein each of the plurality of third coupling paths comprises a respective third impedance element configured to generate a respective contribution to the first feedback signal based on the other one of the first buffered signal and the second buffered signal using a third complex transfer function, wherein each of the plurality of third coupling paths comprises a respective switch circuitry configured to selectively decouple, based on a respective third control signal received from circuitry external to the input buffer circuit, the respective third impedance element from the first input node or the other one of the first output node and the second output node.

14. The input buffer circuit of claim 10, wherein the feedback circuitry further comprises:

a plurality of fourth coupling paths coupled in parallel between the second input node and the one of the first output node and the second output node, wherein each of the plurality of fourth coupling paths comprises a respective fourth impedance element configured to generate a respective contribution to the second feedback signal based on the one of the first buffered signal and the second buffered signal using a fourth complex transfer function, wherein each of the plurality of fourth coupling paths comprises a respective switch circuitry configured to selectively decouple, based on a respective fourth control signal received from circuitry external to the input buffer circuit, the respective fourth impedance element from the second input node or the one of the first output node and the second output node.

15. The input buffer circuit of claim 1, wherein the amplifier buffer is configured to:

generate the first buffered signal based on the first input signal; and generate the second buffered signal based on the second input signal.

16. An analog-to-digital converter, ADC, system, comprising:

an input buffer circuit according to claim 1, wherein the first input node of the buffer amplifier is coupled to a first input node of the ADC system for receiving the first input signal, and wherein the second input node of the buffer amplifier is coupled to a second input node of the ADC system for receiving the second input signal; and an ADC configured to generate digital data based on the first input signal and the second input signal, wherein a first input node of the ADC is coupled to the first output node of the buffer amplifier for receiving the first buffered signal, and wherein a second input node of the ADC is coupled to the second output node of the buffer amplifier for receiving the second buffered signal.

17. The ADC system of claim 16, further comprising:

a plurality of further ADCs each configured to generate respective digital data based on the first input signal and the second input signal, wherein the ADC and the plurality of further ADCs are time-interleaved.

18. The ADC system of claim 17, wherein a respective input buffer circuit according to claim 1 is coupled between the first input node and the second input node of the ADC system and each of the plurality of further ADCs.

19. The ADC system of claim 16, further comprising:

an observation path coupled to the first input node and the second input node of the ADC system for receiving the first input signal and the second input signal, wherein the observation path comprises an observation ADC configured to generate further digital data based on the first input signal and the second input signal; and an equalizer configured to generate an equalized output signal of the ADC system based on the digital data generated by the ADC, wherein the equalizer is configured to adjust, based on the further digital data generated by the observation ADC, at least one equalization parameter used for generating the equalized output signal of the ADC system.

20. The ADC system of claim 19, wherein a sampling rate of the observation ADC is lower than sampling rate of the ADC.

21. A receiver, comprising:

an analog-to-digital converter system according to claim 16; and analog circuitry configured to receive a receive signal, and to supply the first input signal and the second input signal to the analog-to-digital converter system based on the receive signal.

22. The receiver of claim 21, wherein the receive signal is a radio frequency receive signal from an antenna element.

23. The receiver of claim 21, wherein the analog circuitry is configured to receive the receive signal from a wired transmission link.

24. A method for operating an input buffer circuit for an analog-to-digital converter, the method comprising:

receiving a respective one of a first input signal and a second input signal, which form a differential input signal pair for the analog-to-digital converter, at a first input node and a second input node of an amplifier buffer of the input buffer circuit;

generating, by feedback circuitry and based on the first buffered signal and the second buffered signal, a first feedback signal and a second feedback signal for mitigating a respective unwanted signal component at the first input node and the second input node related to a limited reverse isolation of the amplifier buffer; and supplying the first feedback signal to the first input node and the second feedback signal to the second input node by the feedback circuitry.

25. The method of claim 24, wherein a transfer function used for generating the first feedback signal and the second feedback signal is the inverse of a reverse isolation transfer function of the amplifier buffer.

* * * * *